(12) United States Patent
Do (10) Patent No.: US 6,476,625 B1
(45) Date of Patent: Nov. 5, 2002

(54) METHOD FOR DETERMINING COPLANARITY OF ELECTRICAL CONTACT OF BGA TYPE PACKAGES PRIOR TO ELECTRICAL CHARACTERIZATION

(75) Inventor: Nhon T. Do, Mountain View, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/558,294

(22) Filed: Apr. 25, 2000

(51) Int. Cl.$^7$ .............................................. G01R 31/02
(52) U.S. Cl. ...................................................... 324/755
(58) Field of Search ............................. 438/14; 439/91; 324/758

(56) References Cited

U.S. PATENT DOCUMENTS 6,078,186 A * 6/2000 Hembree .................... 324/755

* cited by examiner

*Primary Examiner*—John F. Niebling
*Assistant Examiner*—Andre' C Stevenson (57) ABSTRACT

A method of performing electrical characterization of a chip scale package in which impressionable material, such as copper tape, is applied on a contact surface of an isolation plate of a test fixture. The isolation plate is placed on the tops of an array of electrical contacts of a chip scale package and then pressed against the array of electrical contacts so that at least some of the electrical contacts make an impression in the impressionable material. By examining the impressions in the impressionable material, the coplanarity of the tops of the electrical contacts in the array is determined. This provides a measure of how well grounded the electrical contacts in the array will be when placed in a test fixture with an isolation plate placed on the contacts.

13 Claims, 6 Drawing Sheets

FIG. 13

METHOD FOR DETERMINING COPLANARITY OF ELECTRICAL CONTACT OF BGA TYPE PACKAGES PRIOR TO ELECTRICAL CHARACTERIZATION

RELATED APPLICATIONS

The present invention contains subject matter similar to that disclosed in U.S. patent application Ser. No. 09/892,798, filed Jan. 28, 2001.

FIELD OF THE INVENTION

The present invention relates to the testing of integrated circuits, and in particular, to the preparation of a chip scale package prior to electrical characterization of the package.

DESCRIPTION OF RELATED ART

Electrical components utilizing integrated circuit chips are used in a number of applications. Controlled Collapsed Chip Connection is an interconnect technology developed as an alternative to wire bonding. This technology is generally known as C4 technology, or flip chip packaging. Broadly stated, one or more integrated circuit chips are mounted above a single or multiple layer substrate and pads on the chip are electrically connected to corresponding pads on a substrate by a plurality of electrical connections, such as solder bumps. The integrated circuit chips may be assembled in an array such as a 10×10 array. A substrate is then electrically connected to another electronic device such as a circuit board with the total package being used in an electronic device such as a computer.

It is desirable to perform an electrical characterization of an integrated circuit by measuring inductance (L), capacitance (C), and resistance (R) at electrical contacts of the integrated circuit. This has presented a problem, however, when measuring these parameters for a "chip scale package." Semiconductor dice, or chips, are typically individually packaged for use in plastic or ceramic packages. This is sometime referred to as the first level of packaging. The package is required to support, protect, and dissipate heat from the die and to provide a lead system for power and signal distribution to the die. The package is also useful for performing burn-in and functionality testing of the die.

One type of semiconductor package is referred to as a "chip scale package." Chip scale packages are also referred to as "chip size packages," and the dice are referred to as being "minimally packaged." Chip scale packages can be fabricated in "uncased" or "cased" configurations. Uncased chip scale packages have a footprint that is about the same as an unpackaged die. Cased chip scale packages have a peripheral outline that is slightly larger than an unpackaged die. For example, a footprint for a typical cased chip scale package can be about 1.2 times the size of the die contained within the package.

Typically, a chip scale package includes a substrate bonded to the face of the die. The substrate includes the external contacts for making outside electrical connections to the chip scale package. The substrate for a chip scale package can comprise flexible material, such as a polymer tape, or a rigid material, such as silicon, ceramic, or glass. The external contacts for one type of chip scale package includes solder balls arranged in a dense array, such as a ball grid array "BGA," or a fine ball grid array "FBGA." These dense arrays permit a high input/output capability for the chip scale package. For example, a FBGA on a chip scale package can include several hundred solder balls.

In order to test the electrical characteristics of the integrated circuit, test probes are used to contact individual solder balls. Performing precise measurements of the electrical characteristics on a chip scale package is very difficult, however, due to the dimensions. It is hard to isolate a single solder ball or other electrical contact, while grounding the remainder of the solder balls. Hence, isolation and testing of a single, selected solder ball of an integrated circuit has proven to be a difficult task.

One of the reasons for the problems in performing electrical characterization of a chip scale package is the difficulty of simultaneously grounding all of the solder balls that are to be grounded on the package. Even with modern sophisticated manufacturing techniques, the solder balls of a ball grid array on a chip scale package will typically have heights that are slightly different from one another. It is possible to simultaneously ground all of the solder balls of a ball grid array with a flat conductive plate placed against the solder balls, but only if the conductive plate contacts each one of the balls. This can occur if the solder balls are the same height, but is problematic when the balls are of different heights, as the conductive plate will contact only the highest solder balls.

SUMMARY OF THE INVENTION

There is a need for a method of ensuring that all of the electrical contacts (e.g., solder balls) of a chip scale package make proper contact to a grounding surface of an electrical test fixture.

This and other needs are met by embodiments of the present invention which provide a method of performing electrical characterization of a chip scale package, comprising the steps of applying impressionable material on a contact surface of an isolation plate of a test fixture. The isolation plate is then placed on the tops of an array of electrical contacts of a chip scale package such that the impressionable material contacts at least some of the tops of the electrical contacts. After placement, the isolation plate is pressed against the array of electrical contacts such that at least some of the electrical contacts make an impression in the impressionable material. The impressions in the impressionable material are then examined.

By examining the impressions made in the impressionable material by the pressing of the electrical contacts, the coplanarity of the tops of the electrical contacts can be determined. Due to uneven heights, some of the electrical contacts (the taller ones) will leave deeper impressions in the impressionable material, while other contacts (the shorter ones), will leave less deep impressions or no impressions at all. These latter contacts will not be properly grounded when a grounding plate is later applied on top of the electrical contact array during an electrical characterization process. If it is determined, through the present invention, that the tops of the electrical contacts are not properly coplanar, the chip scale package can be discarded, or a corrective measure can be taken to planarize the tops of the electrical contacts. Once the coplanarity of the electrical contacts is assured, a flat grounding plate can be applied to the array to simultaneously ground all of the electrical contacts, except for a selected subset of the contacts that are isolated for testing.

The earlier stated needs are met by other embodiments of the invention, which provide a method of preparing a chip scale package having a plurality of electrical contacts for electrical characterization. The method comprises the steps of determining non-planarity of tops of the electrical contacts in an array of the chip scale package, and planarizing the tops of the electrical contacts as a function of the determination of non-planarity of the tops of the electrical contacts.

The foregoing and other features, aspects and advantages of the present invention will become more apparent from the following detailed description of the present invention when taken in conjunction with the accompanying drawings.

DETAILED DESCRIPTION OF THE INVENTION

The present invention addresses and solves problems related to the uneven heights of solder balls that have been attached to a chip scale package for SMT board mounting prior to electrical characterization. Due to the uneven heights of the balls, electrical characterization is made more difficult as simultaneous grounding of the balls with uneven heights is problematic. The determination of which contacts of an array of solder balls would not make proper electrical contact to a grounding plate simultaneously applied to the top of the array is difficult to achieve visually, as the height differences between solder balls are very small. Embodiments of the present invention press an impressionable material, such as copper tape, against the top of the array. By examining the impressions left by the electrical contacts in the copper tape, it can be determined which electrical contacts in the array are too short to make proper contact with a grounding plate. Corrective measures can then be taken to planarize the top of the array. Once all of the balls in the ball grid array (BGA) have the same height, a single flat conductive plate may reliably contact and ground all of the solder balls to be grounded.

Prior to discussing the determination of the coplanarity of the electrical contacts of an array of a chip scale package according to the present invention, an exemplary test fixture that may be used for electrical characterization of the chip scale package will be described. However, the present invention may be used with other test fixtures and testing procedures, and finds particular utility where solder balls of even height are advantageous to a testing procedure.

Figure 1:
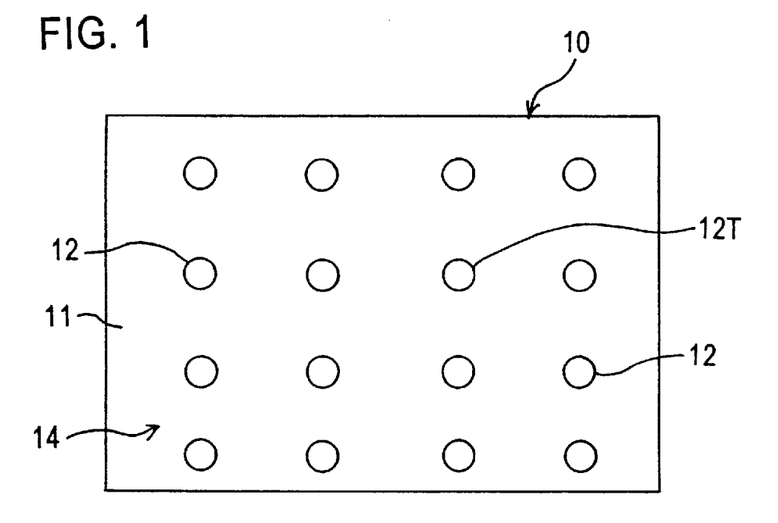
FIG. 1 is an enlarged, schematic top view of an exemplary chip scale package.

An exemplary embodiment of the chip scale package 10 is depicted in top view in FIG. 1. The chip scale package 10 includes a substrate 11, containing the integrated circuitry and/or interconnections. The circuitry is connected to a plurality of electrical contacts 12 formed on one side of the chip scale package 10. In preferred embodiments of the invention, the electrical contacts are formed by substrate balls 12 and are arranged in array 14. Thus, the solder balls form a ball grid array 14. Although depicted for illustration purposes in FIG. 1 as being relatively spread apart, in practice, the substrate balls 12 are very tightly packed on a chip scale package 10 in the ball grid array 14. Thus, it is difficult to isolate one of the solder balls 12 for electrical characteristic testing.

Figure 2:
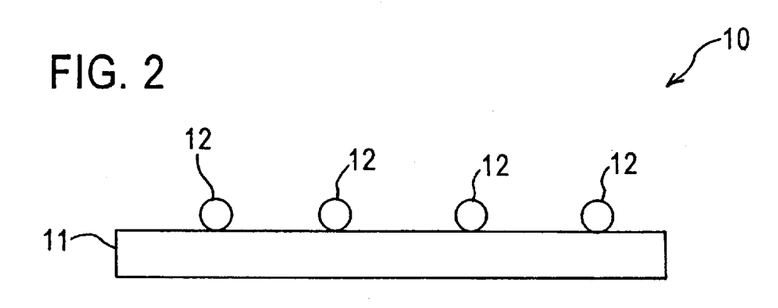
FIG. 2 is a side view of the chip scale package of FIG. 1.

A side view of the chip scale package 10 is provided in FIG. 2. As can be seen from this figure, the electrical contacts or balls extend from only one side of the chip scale package 10. One or more of these solder balls 12 will be a solder ball at which testing is desired. This solder ball to be tested is designated in FIGS. 1 and 2 as 12T. With the remaining balls it is often desirable to ground the remaining balls 12 on the chip scale package 10, at the same time isolating the ball 12T under test.

Figure 3:
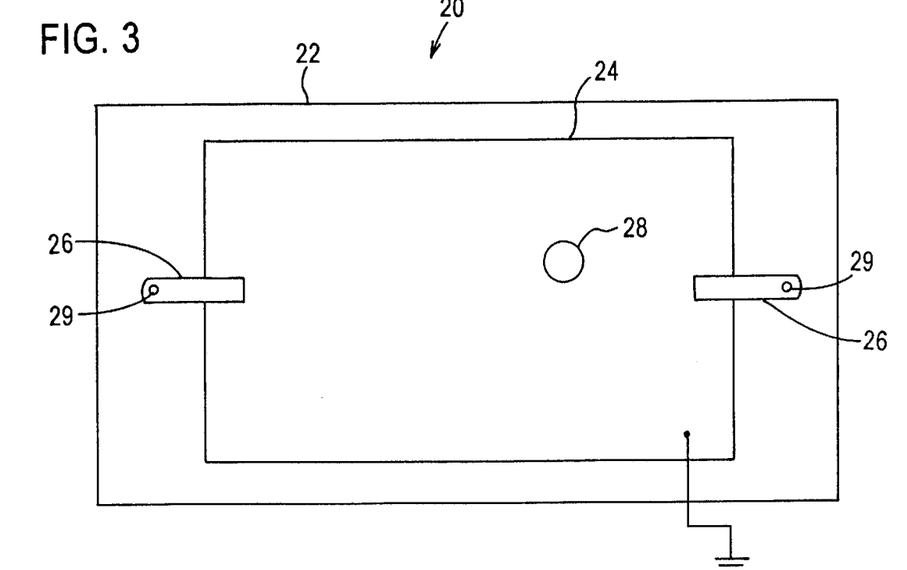
FIG. 3 is a top view of a test fixture constructed in accordance with embodiments of the present invention.

FIG. 3 is a top view of a test fixture that can be used in conjunction with embodiments of the present invention. This test fixture is elegant in construction and relatively inexpensive to create. At the same time, however, it provides a thorough grounding of all of the electrical contacts of the chip scale package 10, allowing an isolated subset of the electrical contacts to be tested for electrical characterization. The test fixture 20 is exemplary only, however, as other configurations of a test fixture may be used to perform electrical characterization following the precoining of the package.

The test fixture 20 of FIG. 3 includes a base 22 made of either conductive or non-conductive material. For example, the base 22 may be made of a metal or may be made of a ceramic or carbon-fiber composite, or any other suitable material. The base 22 is generally planar in shape with a smooth surface so as not to damage a chip scale package placed on the surface of the base 22.

A conductive isolation plate 24, which serves as a grounding plate, is placed over the base 22. Generally, the isolation plate 24 is smaller in area than the base 22 and is substantially planar. The isolation plate 24 is a conductive plate, and is therefore made of a highly conductive material, such as a conductive metal. The isolation plate 24 is coupled to ground.

The isolation plate 24 is held against the base 22 by a pair of clamps 26 in the illustrated example of FIG. 3. Other holding devices, such as elastomeric hold-down devices, replace the clamps 26 in other embodiments of the test fixture. The clamping pressure applied against the isolation plate 24 is adjusted by an adjustment device 29, such as a screw. The adjustment device 29, e.g., a screw, is attached to the base 22.

The isolation plate 24 has a test hole 28 provided at a desired location on the surface of the isolation plate 24. Test hole 28 extends through the isolation plate 24 and is dimensioned so that it is slightly larger than the electrical contact or solder ball 12 of a chip scale package 10. The embodiment of FIG. 3 depicts a single test hole 28, but a plurality of test holes may be provided in isolation plate 24. This would provide access to a plurality of selected balls 12T for testing the electrical characteristics of the chip scale package 10 at these balls 12T. In the embodiment of FIG. 3, however, only a single test hole 28 is depicted.

Figure 4:
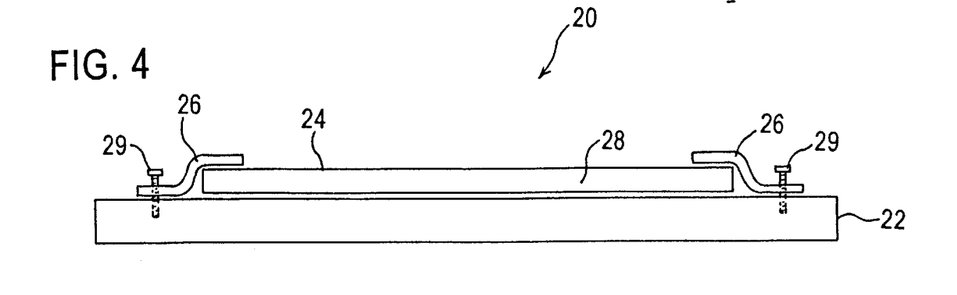
FIG. 4 is a side, view of the test fixture of FIG. 3.

FIG. 4 is a side view of the test fixture 20 of FIG. 3. The chip scale package 10 is inserted between the isolation plate 24 and the base 22. The clamps 26 may be removed and the isolation plate 24 completely removed from the test fixture 20 prior to the positioning of the chip scale package 10 to be tested. The isolation plate 24 is then placed carefully onto the chip scale package 10 and the clamps 26 tightened through the adjustment device 29.

Figure 5:
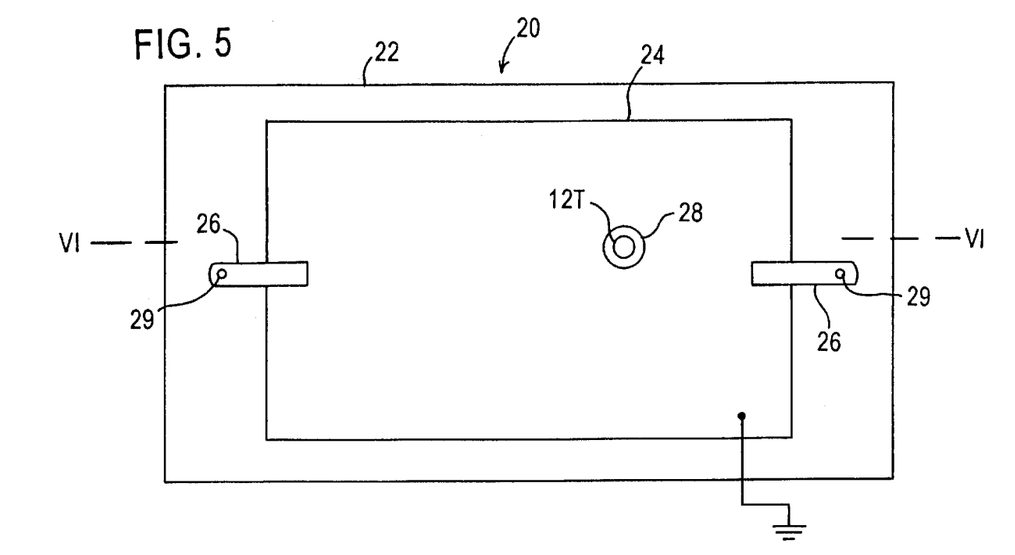
FIG. 5 is a top view of the test fixture of FIG. 3 with a chip scale package under test inserted within the test fixture according to the method of the present invention.
Figure 6:
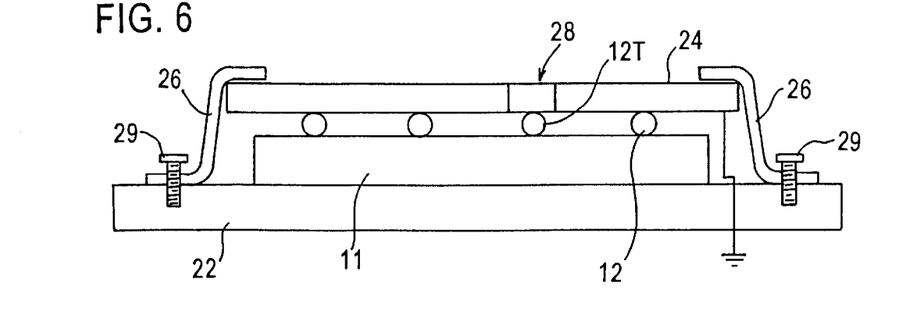
FIG. 6 is a cross-section of the test fixture of FIG. 5 with the inserted chip scale package under test, taken along line VI—VI.

FIG. 5 depicts the test fixture 20 of FIG. 3, but with a chip scale package 10 inserted in the test fixture 20. The chip scale package 10 is properly positioned on the base 22 and the isolation plate 24 is properly positioned on a chip scale package 10 such that the desired solder balls 12T to be tested fall completely within the test hole 28. If more than one solder ball is to be tested, additional test holes 28 are provided in the isolation plate 24. The clamping pressure applied by the adjustment devices 29, as depicted in FIG. 6, is enough to ensure proper contact of the isolation plate 24 against each of the solder balls 12, but not enough to damage the solder balls 12. With proper contact of the solder balls 12 that are not under test to the isolation plate 24, and the grounding of this isolation plate 24, the solder balls 12 that are not under test are all properly grounded.

The subset of electrical contacts or solder balls 12T that are under test are exposed through the test hole or holes 28 in the isolation plate 24. The dimensioning of the test hole 28 in the isolation plate 24 is slightly larger than the solder ball under test 12. This ensures that the solder ball under test 12T does not contact the conductive isolation plate 24. The test hole 28 needs to be large enough, however, to allow a test probe (not shown) to access the solder ball under test 12T without contacting the isolation plate 24. When the test probe is able to establish contact with the ball under test 12T, the electrical characteristics, such as inductance, capacitance, and resistance at the ball under test 12T, which has been effectively isolated from the other balls 12 on the chip scale package 10, may be ascertained.

Figure 7:
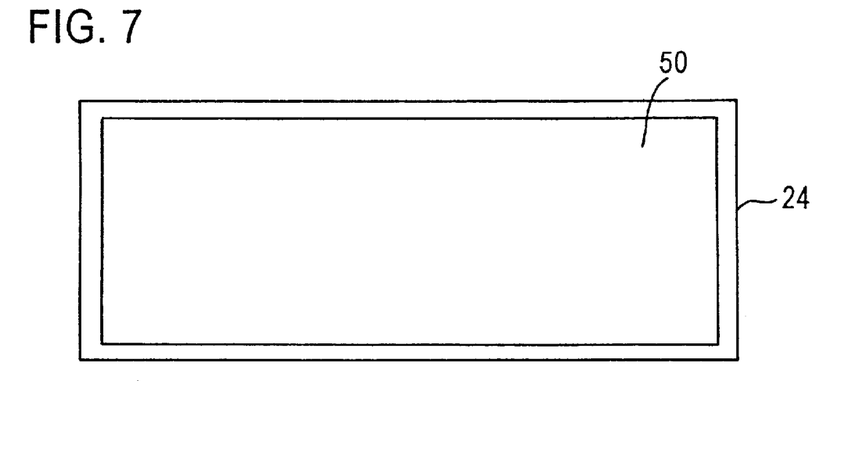
FIG. 7 is a bottom view of an isolation plate of a test fixture with a copper tape applied to the bottom of the isolation plate.

FIG. 7 is a bottom view of an isolation plate 24 of a test fixture, such as that depicted in FIGS. 3–6, with an impressionable material 50 attached to its bottom surface 44 in accordance with embodiments of the present invention. The impressionable material 50 is used with the isolation plate 24 to create an impression of the array of electrical contacts 12 to determine the coplanarity of the tops of the electrical contacts 12, prior to the electrical characterization process.

The impressionable material 50 is a material that may be applied and removed from the isolation plate 24. The impressionable material 50 must be soft enough to be deformed when pressed against electrical contacts, such as solder balls, without severely damaging the electrical contacts. The material 50 must also be somewhat inelastic so as to retain the impressions of the electrical contacts after the impressionable material 50 has been pressed against and then removed from the electrical contacts. A suitable material having these characteristics is copper tape. The copper tape 50 is relatively inexpensive, and can be readily applied and removed from the bottom surface 44 of an isolation plate 24.

Figure 8:
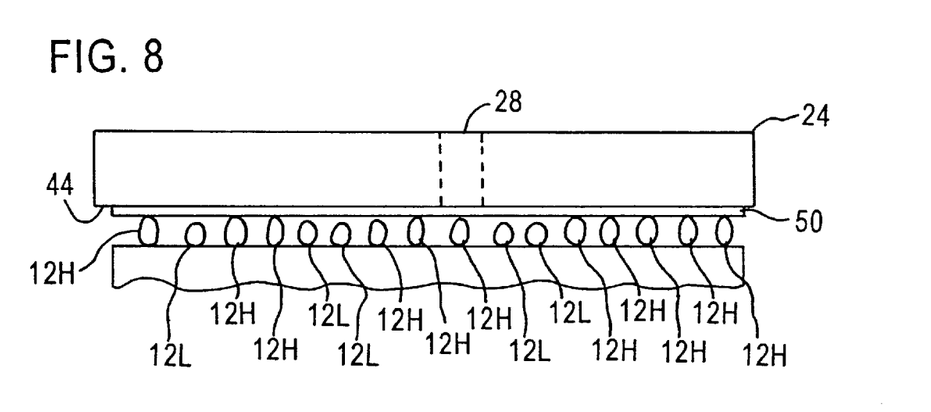
FIG. 8 is a side view of the isolation plate of FIG. 7, following placement of the isolation plate on an array of electrical contacts of a chip scale package and pressing of the isolation plate and copper tape on the array.

FIG. 8 is a side view of the isolation plate 24 after it has been applied against the solder balls 12 of a package to determine the coplanarity of the tops of the solder balls 12. The copper tape 50 on the bottom surface 44 of the isolation plate 24 contacts the tops of the solder balls 12. The solder balls in the array normally exhibit slight differences in height from solder ball to solder ball. This is represented in FIG. 8 by higher solder balls 12H and lower solder balls 12L. Although only a few sizes are shown, there may be a greater number of height differences between the solder balls 12 of a manufactured package.

According to embodiments of the method of the present invention, the isolation plate 24 is pressed slightly on the solder balls 12H, 12L, with enough force to cause the solder balls 12H, 12L to leave impressions in the copper tape. Too much pressure, however, may severely damage the solder balls 12H, 12L.

Figure 9:
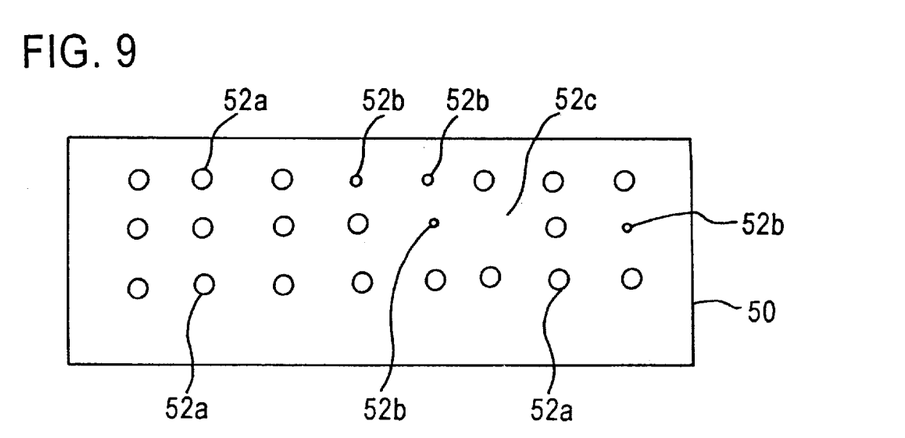
FIG. 9 is a bottom view of an exemplary copper tape of FIG. 7 after the isolation plate and copper tape are lifted off a chip scale package having an array with contacts of uneven heights.

Once the isolation plate 24 and copper tape 50 have been removed from the solder balls 12H, 12L, then the impressions left in the copper tape 50 can be examined. In FIG. 9, an exemplary set of impressions 52a–c is depicted. In this embodiment, the solder balls 12H, 12L are generally ball-shaped, and therefore generally leave circular impressions 52a–c in the copper tape 50.

The impressions in the copper tape 50 are depicted in FIG. 9 as being of different respective sizes. They are shown as a large impression 52a, a medium impression 52b, and a zero or very small impression 52c. These impressions 52a–c correspond to the amount that a solder ball 12 extends above the surface and its relative height in the array of solder balls 12. The greater the height of the solder ball 12 among the solder balls in the array, the larger the impression it will make. Hence, the higher solder balls 12H will leave the larger impressions 52a. The lower solder balls 12L will leave smaller impressions 52b. Solder balls that are relatively very low may make very little or no impression at all, as indicated by 52c.

By examining the impression of the array on the copper tape 50, it is readily determinable which of the solder balls 12 would not make adequate contact with the isolation plate when placed in a test fixture. This would, without corrective action, jeopardize the integrity of the electrical characterization testing of the chip scale package. One response to a determination according to the present invention of poor coplanarity of the electrical contacts is to discard the chip scale package. Another response is to correct the individual contacts that are identified by the process as being too low to bring them to a height that is sufficient to make good contact with the isolation plate 24 in a test fixture. Still another response is detailed below, in which the higher solder balls 12H are pressed and heated to planarize the tops of all of the solder balls.

Figure 10:
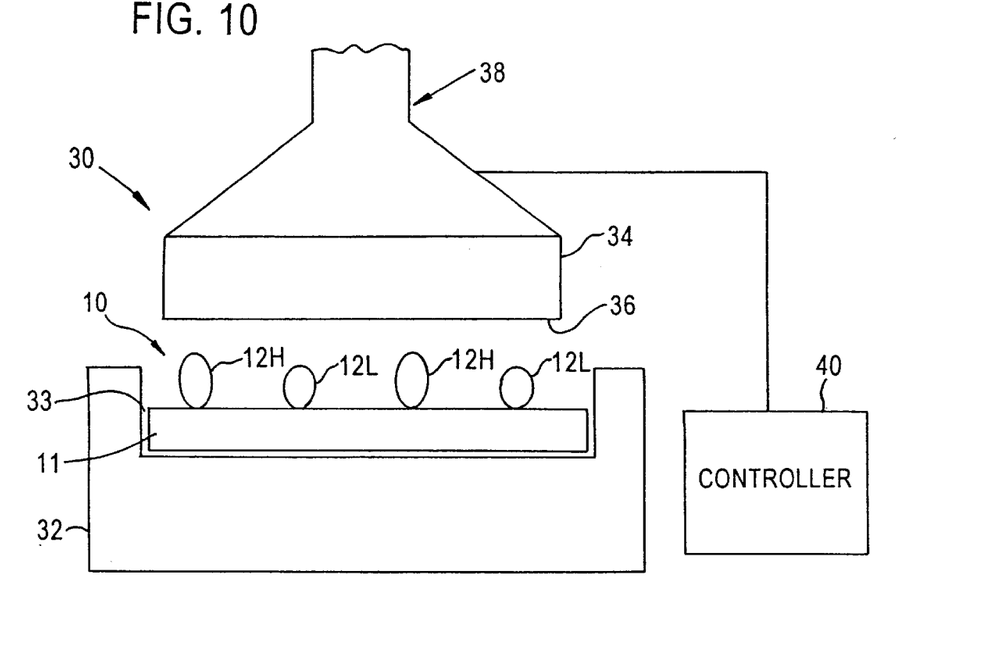
FIG. 10 is a side view of a chip scale package held in a fixture prior to a precoining procedure in accordance with embodiments of the present invention

FIG. 10 is a side view of a precoining apparatus constructed in accordance with embodiments of the present invention, which can be used to prepare a chip scale package for electrical characterization in a test fixture, for example. The precoining apparatus 30 has a holding fixture 32 in which a chip scale package 10 is securely held. The package 10 includes the device attached to the substrate 11. The holding fixture 32 includes a recess 33 that is configured for securely holding the substrate 11 of the chip scale package 10. A non-adjustable holding fixture 32 may be used, as depicted in FIG. 10. In other embodiments, the recess 33 of the holding fixture 32 may be adjusted to accommodate chip scale packages of different sizes.

The precoining apparatus of the present invention further includes a pressing plate 34. The pressing plate 34 may be heated by resistance heating, for example, although other types of heating may be used to heat the plate 34. The pressing plate 34 has a flat, smooth bottom surface 36. A vertical positioning mechanism 38, under the control of a controller 40, moves the pressing plate 34 in a vertical direction towards and away from the holding fixture 32. The controller 40 also controls the temperature of the pressing plate 34, and the pressure applied by the pressing plate 34 to the solder balls 12H. A conventional controller may be used and readily programmed to control the positioning and heating of the pressing plate 34.

Figure 11:
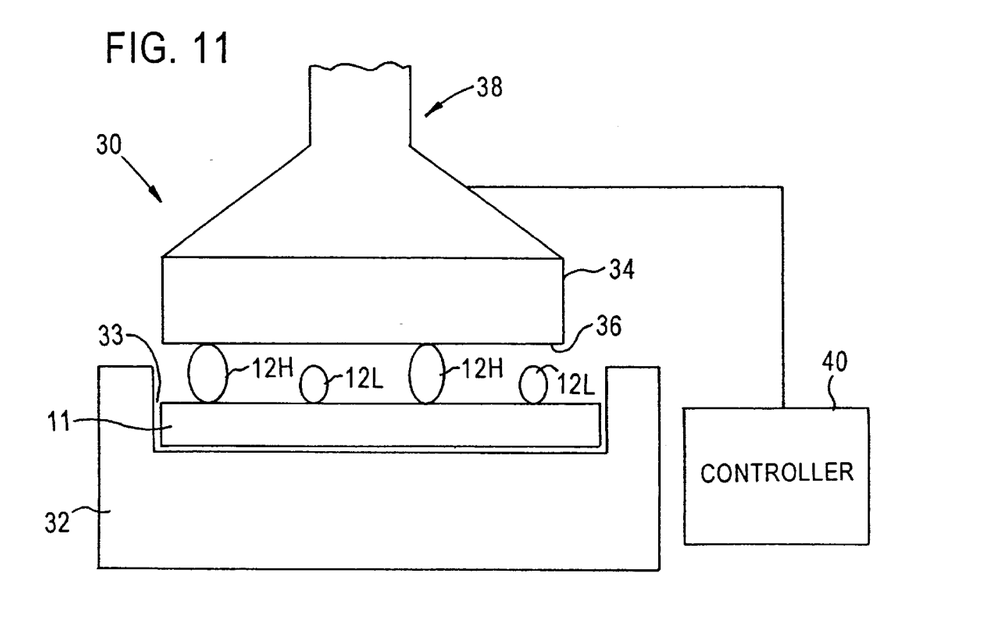
FIG. 11 is a side view of the chip scale package after a heated plate contacts the highest solder balls of the package.

After placement and securement of the package 10 within the holding fixture 32, with the solder balls 12H and 12L exposed, the pressing plate is positioned on the solder balls 12. The pressing plate 34 contacts the highest solder balls 12H first, as depicted in FIG. 11. At this time, the pressing plate 34 may be heated. Alternatively, the pressing plate 34 may be pre-heated. In still other embodiments, the pressing plate 34 is not heated throughout the process, and a purely mechanical pressing of the solder balls 12H is performed.

The controller 40 continues to control the heating of the pressing plate 34 and the vertical movement of the pressing plate 34 in a downward direction via the vertical positioning mechanism 38. A controlled pressure is thus applied against the highest solder balls 12H. The heat applied through the pressing plate 34 to the solder balls 12H causes them to flatten, but avoids the danger of breaking the solder balls, which is possible in embodiments that do not use heat in addition to pressure to deform the highest balls. The temperature should be high enough to cause a slight flow of the solder in the solder balls 12H, but not enough to overly deform the balls 12H.

Figure 12:
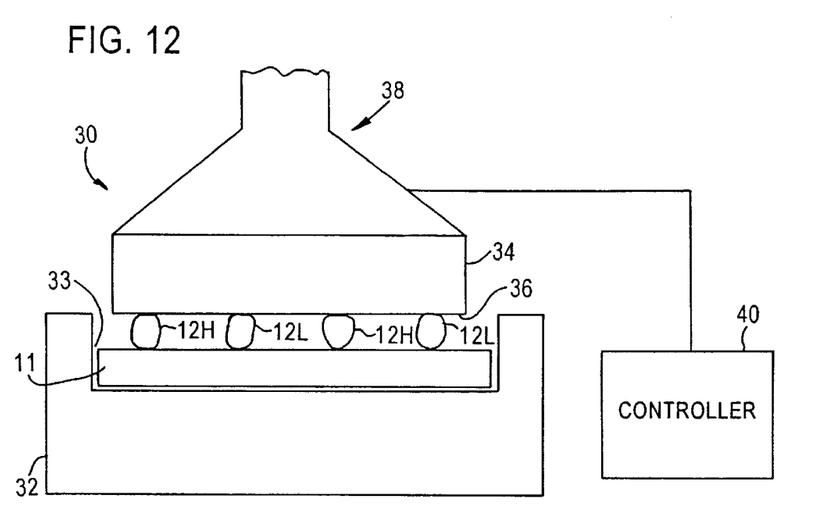
FIG. 12 is a side view of the chip scale package of FIG. 11, after the heated plate compresses the highest solder balls of the package.

FIG. 12 depicts the precoining apparatus 30 after the pressing plate 34 has pressed the highest solder balls 12H to have the same height as the lowest solder balls 12L. It should be understood that the package 10 may have a number of solder balls with different heights, and not just two solder ball heights, as depicted in FIGS. 10 and 11 for explanatory purposes. The tops of the highest solder balls 12H (i.e., those solder balls that extend furthest from the package surface) are now coplanar with the tops of the lowest solder balls 12L (i.e., those solder balls that extend the least extent from the package surface).

Figure 13:
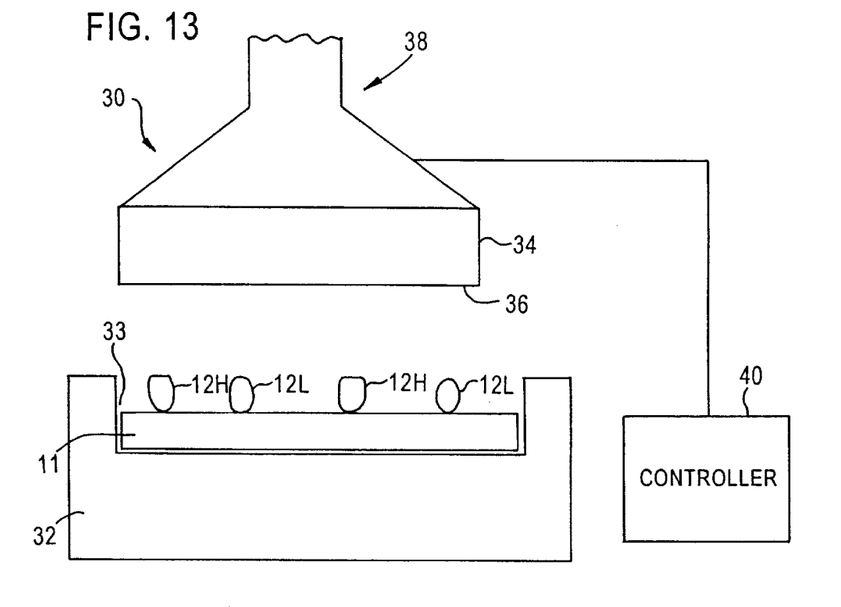
FIG. 13 is a side view of the chip scale package of FIG. 12, following the precoining process of the present invention.

Once the pressing plate 34 has completed pressing against the tops of the solder balls 12H with a controlled pressure until a portion of the top of each of the solder balls 12H, 12L are coplanar, the pressing and the heating are stopped. The pressing plate 34 is moved in an upward direction to its initial position, as shown in FIG. 13. The highest solder balls 12H have been slightly flattened, and exhibit flattened portions 42. A portion of the top of each of the solder balls 12H, 12L is coplanar with the portion of the top of each of the other solder balls 12H, 12L in the array.

Once the precoining process is completed, the package 10 may be removed from the holding fixture 32 and placed into a test fixture, such as the exemplary test fixture of FIG. 3. Due to the planarization of the tops of the solder balls 12H, 12L, a grounding plate placed on the solder balls 12H, 12L will reliably contact each of the desired solder balls 12H, 12L, except for those solder balls 12T that are to be tested.

The determination of the coplanarity of the tops of the electrical contacts in an array, such as a ball grid array of a chip scale package, in accordance with the present invention provides the tester with the assurance that all of the electrical contacts will be properly grounded when the package is placed in a test fixture. This improves the electrical characterization process for chip scale packages. The use of an impressionable material, such as copper tape, to make impressions of the tops of the electrical contacts, provides a relatively inexpensive and elegant way to determine coplanarity.

Although the present invention has been described and illustrated in detail, it is to be clearly understood that the same is by way of illustration and example only and is not to be taken by way of limitation, the scope of the present invention being limited only by the terms of the appended claims.

What is claimed is:

1. A method of performing electrical characterization of a chip scale package, comprising the steps of:

applying impressionable material on a contact surface of an isolation plate of a test fixture;

placing the isolation plate on the tops of an array of electrical contacts of a chip scale package such that the impressionable material contacts at least some of the tops of the electrical contacts;

pressing the isolation plate against the array of electrical contacts such that at least some of the electrical contacts make an impression in the impressionable material; and examining the impressions in the impressionable material to determine the co-planarity of the tops of the electrical contacts in the array;

wherein the electrical contacts are solder balls of a ball grid array; and wherein the impressionable material is a metallic tape.

2. The method of claim 1, wherein the metallic tape is a copper tape.

3. The method of claim 2, further comprising correcting non-planarity of the tops of the electrical contacts as a function of the impressions in the impressionable material.

4. The method of claim 3, further comprising removing the impressionable material from the isolation plate and placing the isolation plate against the tops of the electrical contacts of the array.

5. The method of claim 4, further comprising grounding the isolation plate to thereby ground the electrical contacts of the array that contact the isolation plate.

6. A method of performing electrical characterization of a chip scale package, comprising the steps of:

applying impressionable material on a contact surface of an isolation plate of a test fixture;

placing the isolation plate on the tops of an array of electrical contacts of a chip scale package such that the impressionable material contacts at least some of the tops of the electrical contacts;

pressing the isolation plate against the array of electrical contacts such that at least some of the electrical contacts make an impression in the impressionable material;

examining the impressions in the impressionable material to determine the co-planarity of the tops of the electrical contacts in the array; and further comprising correcting non-planarity of the tops of the electrical contacts as a function of the impressions in the impressionable material.

7. The method of claim 6, further comprising removing the impressionable material from the isolation plate and placing the isolation plate against the tops of the electrical contacts of the array.

8. The method of claims 7, further comprising grounding the isolation plate to thereby ground the electrical contacts of the array that contact the isolation plate.

9. A method of preparing a chip scale package having a plurality of electrical contacts for electrical characterization, the method comprising the steps of:

determining non-planarity of tops of the electrical contacts in an array of the chip scale package; and planarizing the tops of the electrical contacts as a function of the determination of non-planarity of the tops of the electrical contacts;

wherein the step of determining includes:

applying an impressionable material to a planar surface of a flat plate;

pressing the planar surface and the impressionable material against the tops of the array sufficiently to create impressions of the electrical contacts in the impressionable material; and examining the impressions in the impressionable material to determine non-planarity of the tops of the array.

10. The method of claim 9, wherein the impressionable material is a metallic tape.

11. The method of claim 10, wherein the metallic tape is a copper tape.

12. The method of claim 11, wherein the step of planarizing includes pressing a heated plate against the electrical contacts with a controlled pressure until the tops of the electrical contacts are planarized.

13. The method of claim 12, wherein the electrical contacts are solder balls.

* * * * *